(12) United States Patent
Tsern et al.

(10) Patent No.: US 6,345,009 B1
(45) Date of Patent: *Feb. 5, 2002

(54) APPARATUS AND METHOD FOR REFRESHING SUBSETS OF MEMORY DEVICES IN A MEMORY SYSTEM

(75) Inventors: Ely K. Tsern, Los Altos; Richard M. Barth, Palo Alto; Paul G. Davis; Craig E. Hampel, both of San Jose, all of CA (US); Thomas J. Holman; Andrew V. Anderson, both of Portland, OR (US)

(73) Assignee: Rambus Inc., Los Altos, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/658,465

(22) Filed: Sep. 8, 2000

Related U.S. Application Data

(62) Division of application No. 09/169,590, filed on Oct. 9, 1998, now Pat. No. 6,178,130.
(60) Provisional application No. 60/061,665, filed on Oct. 10, 1997.

(51) Int. Cl.[7] .................................................. G11C 7/00
(52) U.S. Cl. ........................ 365/222; 365/120; 711/106
(58) Field of Search ................................ 365/222, 120; 711/106

(56) References Cited

U.S. PATENT DOCUMENTS

| | | | | |
|---|---|---|---|---|
| 5,251,177 A | * | 10/1993 | Akamatsu et al. | 365/222 |
| 5,535,169 A | * | 7/1996 | Endo et al. | 365/222 |
| 5,940,851 A | * | 8/1999 | Leung | 365/222 |
| 5,999,471 A | * | 12/1999 | Choi | 365/222 |
| 6,178,130 B1 | * | 1/2001 | Tsern et al. | 365/222 |

* cited by examiner

*Primary Examiner*—Richard Elms
*Assistant Examiner*—VanThu Nguyen
(74) *Attorney, Agent, or Firm*—Pennie & Edmonds LLP

(57) ABSTRACT

A memory system includes a set of memory devices. An interconnect structure links the set of memory devices to one another. A memory controller is connected to the interconnect structure. The memory controller is configured to apply a control signal to the interconnect structure such that a specified subset of the set of memory devices performs a refresh operation.

23 Claims, 4 Drawing Sheets

Striped bank indicates that the bank is free and a refresh operation can occur.

Striped bank indicates that the bank is free and a refresh operation can occur.

|  | Bank i of Device 0 | Bank i of Device 1 | Bank i of Device 2 | Bank i of Device 3 | Bank i of Device 4 | Bank i of Device 5 | Bank i of Device 6 | Bank i of Device 7 |
|---|---|---|---|---|---|---|---|---|
| For X = 1 bit, C = 0 | ▨ | ☐ | ▨ | ☐ | ▨ | ☐ | ▨ | ☐ |
| C = 1 | ☐ | ▨ | ☐ | ▨ | ☐ | ▨ | ☐ | ▨ |
| For X = 2 bits, C = 00 | ▨ | ☐ | ☐ | ☐ | ▨ | ☐ | ☐ | ☐ |
| C = 01 | ☐ | ▨ | ☐ | ☐ | ☐ | ▨ | ☐ | ☐ |
| C = 10 | ☐ | ☐ | ▨ | ☐ | ☐ | ☐ | ▨ | ☐ |
| C = 11 | ☐ | ☐ | ☐ | ▨ | ☐ | ☐ | ☐ | ▨ |
| For X = 3 bits, C = 000 | ▨ | ☐ | ☐ | ☐ | ☐ | ☐ | ☐ | ☐ |
| C = 001 | ☐ | ▨ | ☐ | ☐ | ☐ | ☐ | ☐ | ☐ |
| C = 010 | ☐ | ☐ | ▨ | ☐ | ☐ | ☐ | ☐ | ☐ |
| C = 011 | ☐ | ☐ | ☐ | ▨ | ☐ | ☐ | ☐ | ☐ |
| C = 100 | ☐ | ☐ | ☐ | ☐ | ▨ | ☐ | ☐ | ☐ |
| C = 101 | ☐ | ☐ | ☐ | ☐ | ☐ | ▨ | ☐ | ☐ |
| C = 110 | ☐ | ☐ | ☐ | ☐ | ☐ | ☐ | ▨ | ☐ |
| C = 111 | ☐ | ☐ | ☐ | ☐ | ☐ | ☐ | ☐ | ▨ |

FIG. 5

For X = 1 bit,
C = 0, M = 1001

C = 1, M = 0110

Bank i of Device 0 | Bank i of Device 1 | Bank i of Device 2 | Bank i of Device 3 | Bank i of Device 4 | Bank i of Device 5 | Bank i of Device 6 | Bank i of Device 7

FIG. 6

APPARATUS AND METHOD FOR REFRESHING SUBSETS OF MEMORY DEVICES IN A MEMORY SYSTEM

This is a division of application Ser. No. 09/169,590, filed Oct. 9, 1998, now U.S. Pat. No. 6,178,130.

This application claims priority to the provisional patent application entitled "Multi-Device Refresh Application", Ser. No. 60/061,665, filed Oct. 10, 1997.

BACKGROUND OF THE INVENTION

1. Field of the Invention

This invention relates generally to memory systems. More particularly, this invention relates to an improved technique for performing a refresh operation in a memory system.

2. Description of the Related Art

Dynamic RAM (DRAM) devices require periodic refresh operations to retain data in their storage cells. A refresh operation consists of a row sense operation and a row precharge operation. Each memory cell needs to be refreshed within a given time interval known as $T_{ref}$, the refresh period. A typical $T_{ref}$ value is 64 ms.

As the number of banks in memory devices increases and as the number of devices in memory systems increases, the issue rate of refresh commands sent from a memory controller also increases. This increased traffic due to refresh operations can introduce an overhead that unacceptably impacts performance, as measured by effective data bandwidth and memory access latency. For a given memory system, the number of refresh operations that need to be performed within $T_{ref}$ equals $$\sum_{i=0}^{N-1} B_i R_i, \quad \text{(Eq 1)}$$

where N=maximum number of devices in the system, $B_i$=the number of banks in device i, and $R_i$=the number of rows per bank in device i. A design goal is to maintain a constant frequency of refresh commands over many DRAM generations so that channel overhead does not grow and complexity in the controller is minimized.

One general approach to reduce controller refresh overhead is to perform refresh operations in multiple devices using a single issued command. The simplest way to do this is with a broadcast refresh command, which triggers refresh operations in all devices in the system. With a single refresh command, more than one device can be either simultaneously or sequentially refreshed. From a performance standpoint, it is more desirable to refresh banks in each device simultaneously, so that the time that bank resources are tied up is minimized.

Simultaneous multi-device refresh, however, has its challenges. One challenge is the problem of current spikes. Each refresh operation for each device requires a certain amount of supply current over time. FIG. 1 shows a typically current profile over time for a row sense operation. Note that very near time 0, there is an initial spike of current. This spike is large because the row sensing circuits have been designed to access cell data as quickly as possible in order to minimize the latency to the first allowable page access to bits stored in the sense amps. This spike, characterized by rate of change in current, dI/dt, can cause noise problems in a DRAM, since current spikes can reduce the internal supply voltage. In addition, the current spike can cause failure in circuits on the same die or on other devices that share the same supply voltage.

It is common for memory devices in a memory system to share the same supply voltage. FIG. 2 illustrates a set of memory devices 20A–20N that share a common supply voltage Vdd. Without a sufficient bypass capacitor network 22 in the system, current spikes from each device can cause the supply voltage to vary, and with a shared supply, current spike noise can couple between memory devices. With multiple devices simultaneously doing refresh operations, the current spike effect can be additive, thus causing greater probability of circuit failure. The more devices performing the operation simultaneously, the bigger the potential problem. The amount of noise that can be tolerated varies depending on the bypass network and circuit designs.

In view of the foregoing, it would be highly desirable to provide a mechanism for reducing current spikes and related problems associated with memory refresh operations.

SUMMARY OF THE INVENTION

A memory system includes a set of memory devices. An interconnect structure links the set of memory devices to one another. A memory controller is connected to the interconnect structure. The memory controller is configured to apply a control signal to the interconnect structure such that a specified subset of the set of memory devices performs a refresh operation.

The selective refresh operation may be implemented with a device mask, which includes a single bit for each device in the system to specify whether each device performs the operation. This embodiment requires N bits to control N devices in the system and allows any arbitrary pattern of device operation. A second implementation utilizes a partial decode technique, which selects a subgroup of devices using X bits, where X<Y, Y=log2 N, and N=(max. # of devices in the system). Combinations of these two implementations are also possible.

The selective refresh operation of the invention helps reduce supply noise problems otherwise induced when many devices perform operations simultaneously.

BRIEF DESCRIPTION OF THE DRAWINGS

For a better understanding of the invention, reference should be made to the following detailed description taken in conjunction with the accompanying drawings, in which:

FIG. 5 illustrates encoded device selection in accordance with an embodiment of the invention.

FIG. 6 illustrates a hybrid device selection technique in accordance with an embodiment of the invention.

Like reference numerals refer to corresponding parts throughout the drawings.

DESCRIPTION OF THE PREFERRED EMBODIMENTS

The present invention provides selection mechanisms to help minimize the problem of simultaneous switching noise between memory devices. Specifically, this invention provides different ways to use "narrowcast" refresh commands. Unlike broadcast refresh commands which trigger refreshes in all devices in the system, narrowcast commands specify a subset of devices in the system that can perform a given operation. The basic idea is that narrowcast commands can be used to control the number of devices performing the refresh operation to minimize switching noise.

In accordance with one embodiment of the invention, a set of N mask bits is sent with the refresh commands. This device mask selects which of the N devices on the channel performs the operation. Since there is a bit in the mask for each device in the system, any arbitrary pattern of device operation can be fully specified using any arbitrary mask pattern.

Figure 1:
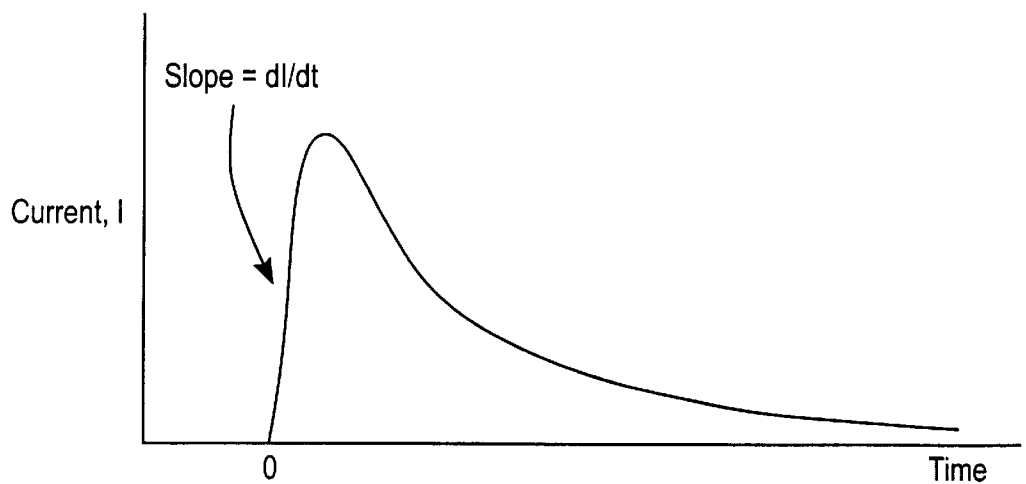
FIG. 1 illustrates a current spike associated with prior art refresh operations.
Figure 2:
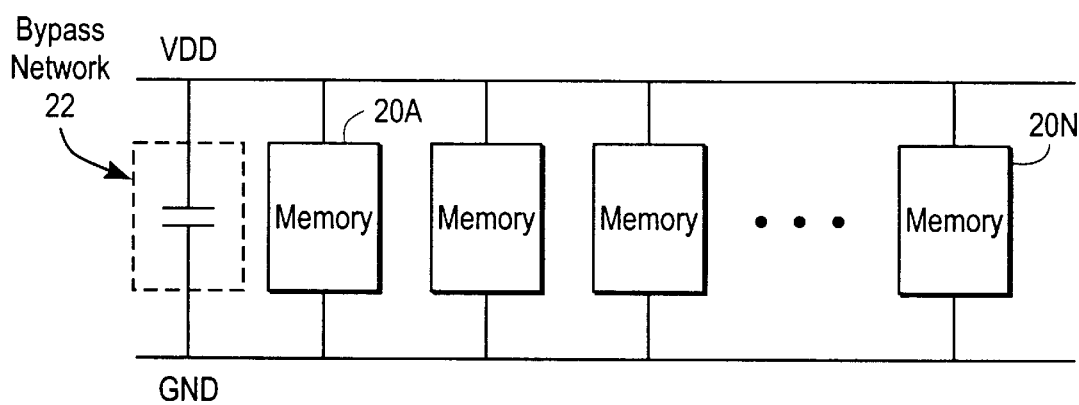
FIG. 2 illustrates a set of memory devices sharing a common supply voltage in accordance with the prior art.
Figure 3:
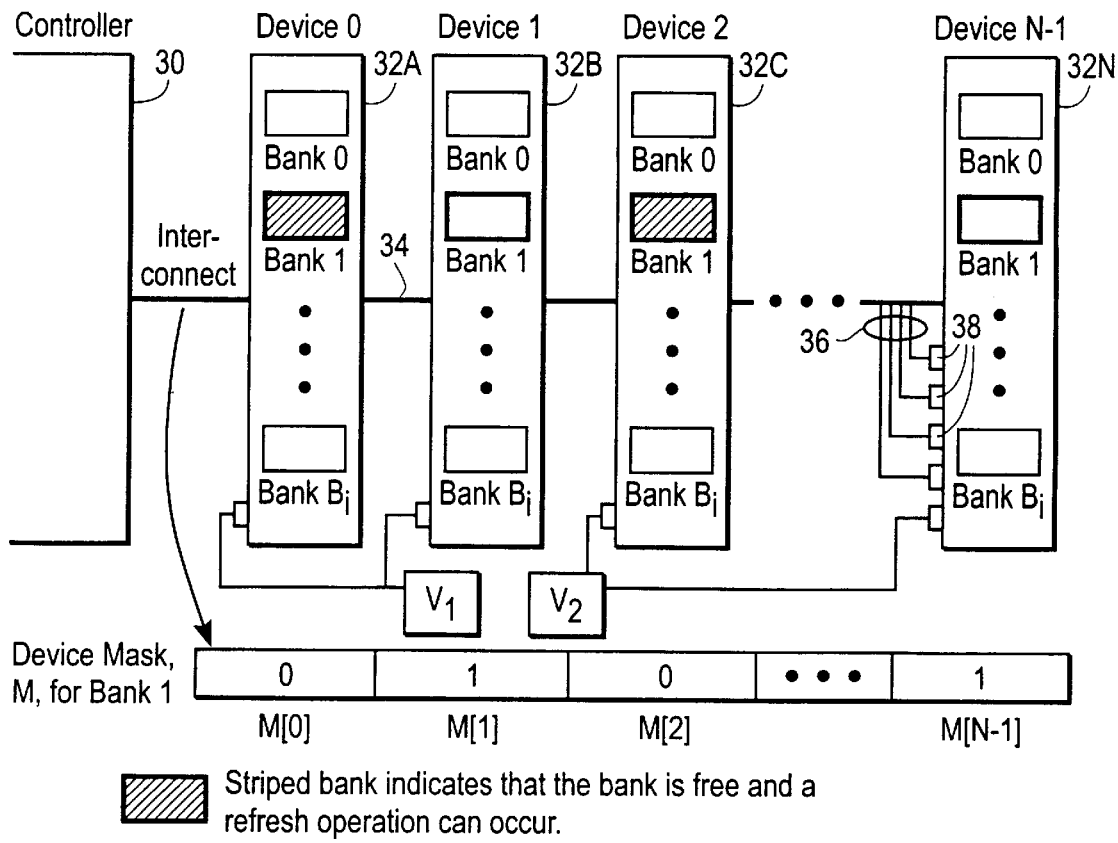
FIG. 3 illustrates the selective refresh technique utilized in accordance with an embodiment of the invention.

FIG. 3 illustrates a memory controller 30, a set of memory devices 32A–32N, and an interconnect structure 34 linking the memory devices 32 and the memory controller 30. The interconnect structure 34 includes individual signal lines 36, including, for example, control and data lines. The interconnect 34 is attached to individual nodes or pins 38 of each memory device 32. The nodes 38 may include a dedicated node to receive a mask signal and a multiplexed node to receive a mask signal. FIG. 3 also illustrates a first supply voltage VI attached to a first subset of memory devices 32A and 32B, and a second supply voltage V2 attached to a first subset of memory devices 32A and 32B, and a second supply voltage V2 attached to a second subset of memory devices 32C–32N. The figure shows N devices, each with multiple banks. The interconnect 34 connects the memory devices and the controller and includes the data and control wires over which the refresh command and device mask bits are sent. This figure illustrates the example of a refresh command being issued to bank 1 of all devices. The Nbit device mask, shown in the figure, specifies which devices the refresh command is directed towards. So, for instance, M[1] has the value "1", so the refresh command is disabled for device #1. M[2] has the value "0", so the refresh command is enabled for device #2. The striped banks in the figure represent those banks in which refresh occurs as the device mask specifies.

Figure 4:
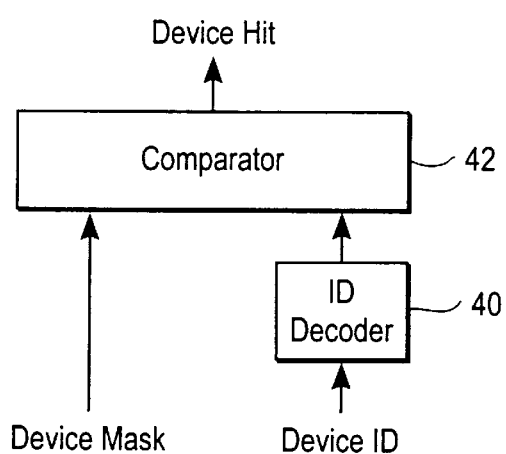
FIG. 4 illustrates a device mask decoder circuit that may be utilized in accordance with an embodiment of the invention.
Figure 3:
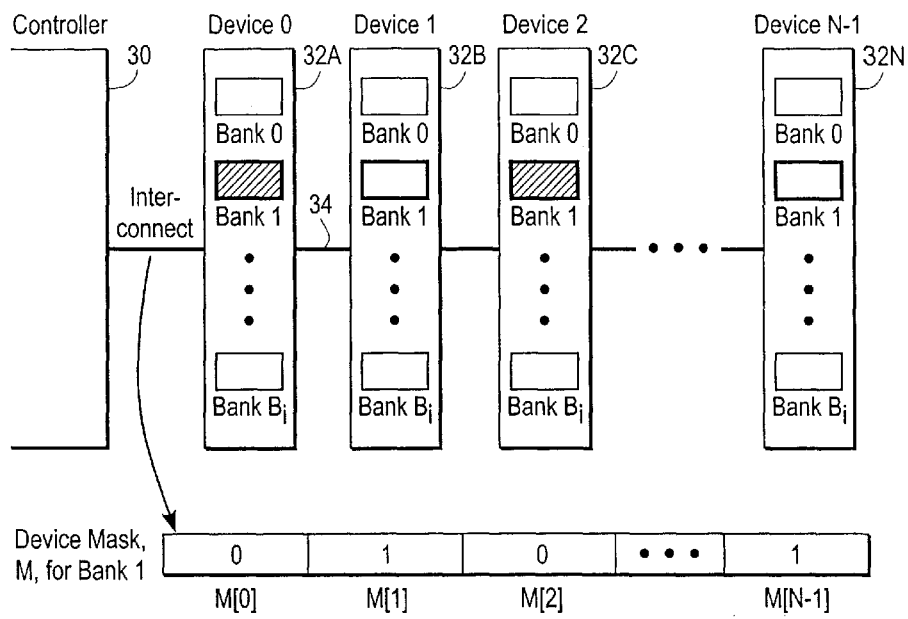
Figure 4:
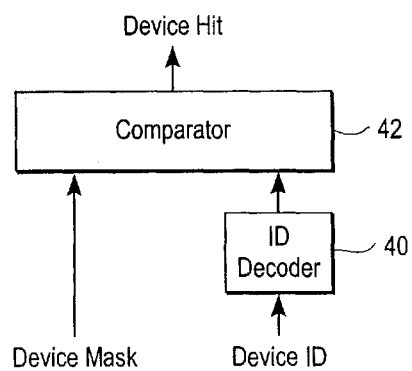

During initialization, each device on the channel gets assigned a device ID. As shown in FIG. 4, a decoder block 40 uses the device ID to decode the bits in the device mask to which it is assigned. The decoded value is compared with a device mask value at a comparator 42. When the values match, there is a device hit.

The use of the device mask is particularly useful if there are banks with ongoing row operations, which tie up bank resources and prevent refresh operations from occurring. If a broadcast refresh to the same bank in all devices is used, the controller would have to wait until those bank resources are freed up before issuing the refresh operation, thus introducing additional delay and pipeline bubbles. With an N-way mask, the controller can specify refresh operations in devices without bank resource conflicts. This will allow refresh operations to be interleaved efficiently with regular memory operations, thus minimizing refresh overhead.

When enabling operations in multiple devices simultaneously using the device mask, it may also be desirable to spread out the mask pattern in such a way that the physical distance between the enabled devices is maximized. This is particularly useful in large systems, where physical distance between devices are large enough so that control signals may have significant propagation time down the wires. Such propagation time can actually help stagger the current spikes and help reduce the additive noise effect.

There are different ways to transmit the device mask bits to the devices over the interconnect, depending on the interconnect structure and device protocol. One simple way is to allocate N additional wires to carry the N-bit device mask in parallel. This approach is low latency, but has higher cost due to the large number of additional wires in the interconnect. For packet-based protocols, where all control bits are sent over a bus of fixed width, the device mask can be sent over the interconnect in a packet format.

It is also possible for systems with multiple voltage supplies and grounds to use a separate device mask for each supply/ground pair. Alternately, the mask signal can be used to select a minimum number of devices in each voltage supply/ground grouping.

Another way to perform narrowcast refresh is the binary encoded approach, which selects a subgroup of devices using X bits, where $X \leq Y$, Y=ceiling(log2 N), and N=(max. #of devices in the system). An X-bit encoded word selects a group of M devices, where $M=N/2^x$. Compared with the device mask, the encoded approach requires less control bandwidth at the cost of less flexibility in selectivity.

FIG. 5 illustrates this encoding approach in an example with a system of eight devices (N=8, Y=3). Each box represents a given bank in each device in the system, and the striped boxes are those selected by the code word, C. Using a 1-bit code word (X=1), the code word C=0 selects all even numbered devices, and C=1 selects all odd numbered devices. Using a 2-bit code word (X=2), a quarter of the devices are selected, and note that only four possible selection patterns are possible. Finally, the 3-bit code word (X=3) illustrates the end case, in which X=Y and the code word has enough bits to fully encode the devices in the system.

Combinations of device mask and binary-encoded selection are also possible. By combining both approaches, the overall number of control bits used to perform the selection can be reduced from the fully specified N-bit device mask. FIG. 6 shows a mask with less than N bits and specifies device selection among a subset of devices. A separate code word, C, selects which subset of devices to which the mask is applied. In the example in the figure, there are eight devices in the system (N=8), and like FIG. 5, each box represents a given bank in each device. The boxes with the thick border represent those devices selected with the encoded code word, C, and the striped boxes are those selected by the device mask, M. Both the code word and mask are sent over the interconnect in conjunction with a refresh command.

All the masking techniques of the invention also apply to the masking of banks within a memory device. The same noise spike problems can also occur with simultaneous bank operations, and a person skilled in the art would be able to apply these masking techniques to the control of multi-bank operations within a device.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art trust utilize the invention and various embodiments with various modifications as are suited to the particular use contemplated. It is intended that the scope of the invention be defined by the following Claims and their equivalents.

What is claimed is:

1. A memory system, comprising:

a set of memory devices;

an interconnect structure linking said set of memory devices; and a memory controller connected to said interconnect structure, said memory controller configured to apply a control signal to said interconnect structure that causes at least two, but not all, memory devices of said set of memory devices to perform a refresh operation.

2. The memory system of claim 1 wherein said control signal includes a refresh command having mask information.

3. The memory system of claim 2 wherein said mask information includes N bits corresponding to N memory devices of said set of memory devices, and wherein each memory device of said set of memory devices compares a stored device identification value to said mask information.

4. The memory system of claim 2 wherein each memory device of said set of memory devices compares a stored device identification value to said mask information.

5. The memory system of claim 2 wherein said mask information is a binary encoded selection value that includes X bits and selects a group of memory devices that includes at least two memory devices, where $X<\log_2 N$, and N is a number of memory devices in said set of memory devices.

6. A memory device, comprising:

a memory core to store data; and interface circuitry to receive a refresh command with a mask value, said interface circuitry including circuitry to identify a memory device refresh selection state wherein said mask value corresponds to a memory device identification value, said interface circuitry initiating a refresh operation on said memory core in response to said memory device refresh selection state.

7. The memory device of claim 6, wherein said mask value is an N-bit mask value, wherein each bit of said mask value corresponds to at least one of a plurality of memory devices, wherein said interface circuitry identifies said memory device refresh selection state when a predetermined bit of said N-bit mask value corresponds to said memory device identification value.

8. The memory device of claim 6, wherein said memory device identification value is received by said memory device during initialization.

9. The memory device of claim 6, wherein said interface circuitry includes a comparator to identify when said mask value matches said memory device identification value.

10. The memory device of claim 6, wherein said mask value is a binary encoded selection value that includes X bits and selects a group of memory devices that includes at least two memory devices, where $X<\log_2 N$, and N is a number of memory devices in said plurality of memory devices, wherein said interface circuitry determines if said binary encoded selection value corresponds to a device group within which said memory device is included.

11. The memory device of claim 6, wherein said mask value includes a binary encoded value and a mask value, wherein said interface circuitry determines when said binary encoded value specifies a selected group of memory devices and when said mask portion specifies memory devices within said selected group.

12. A memory system, comprising:

an interconnect structure; and a plurality of memory devices coupled to said interconnect structure, wherein each memory device of said plurality of memory devices is operable to receive a refresh command via said interconnect structure, wherein, in response to said refresh command, selected memory devices of said plurality of memory devices initiate refresh operations when a mask value included in said refresh command corresponds to a predetermined value within said selected memory devices, said selected memory devices including at least two, but less than all, of said plurality of memory devices.

13. The memory system of claim 12, wherein said mask value is a binary encoded selection value that includes X bits and selects a group of memory devices that includes at least two memory devices, where $X<\log_2 N$, and N is a number of memory devices in said plurality of memory devices.

14. The memory system of claim 12, wherein said mask value includes a binary encoded portion and a mask portion, wherein said binary encoded portion selects a group of memory devices from said plurality of memory devices, and said mask portion selects at least one memory device from said group of memory devices.

15. The memory system of claim 12, wherein said mask value is an N-bit mask value, wherein each bit of said mask value corresponds to at least one of said plurality of memory devices, wherein a memory device corresponding to a selected bit of said mask value is selected for refresh when said selected bit is in a predetermined binary state.

16. The memory system of claim 15, wherein said plurality of memory devices includes N memory devices and each bit of said mask value corresponds to one of said N memory devices.

17. A memory device, comprising:

a memory core to store data; and interface circuitry to receive a refresh command that specifies a subset of memory devices included in a memory system in which said memory device resides, said subset of memory devices including more than one and less than all of said memory devices within said memory system, wherein said interface circuitry is operable to initiate a refresh operation on said memory core when said memory device is specified within said subset of memory devices.

18. The memory device of claim 17, wherein said refresh command includes a mask value with an N-bit mask value, wherein each bit of said mask value corresponds to a memory device within said memory system.

19. The memory device of claim 18, wherein said mask value is a binary encoded selection value that includes X bits and selects a group of memory devices that includes at least two memory devices, where $X<\log_2 N$, and N is a number of memory devices in said memory system.

20. The memory device of claim 18, wherein said mask value includes a binary encoded value and a mask portion, wherein said interface circuitry determines when said binary encoded value specifies a selected group of memory devices and when said mask portion specifies memory devices within said selected group.

21. A memory system, comprising:

a set of memory devices;

an array of memory banks associated with each memory device;

an interconnect structure linking said set of memory devices; and a memory controller connected to said interconnect structure, said memory controller configured to apply a control signal to said interconnect structure that causes at least two, but not all, memory devices of said set of memory devices to perform a refresh operation; and wherein said refresh operation comprises refreshing at least one of said memory banks associated with said memory device performing said refresh operation.

22. The memory system of claim 21 wherein said control signal includes a refresh command having mask information.

23. The memory system of claim 22 wherein said mask information includes N bits corresponding to N memory devices of said set of memory devices.

* * * * *

UNITED STATES PATENT AND TRADEMARK OFFICE
CERTIFICATE OF CORRECTION

PATENT NO. : 6,345,009 B1
DATED : July 10, 2003
INVENTOR(S) : Ely K. Tsern et al.

It is certified that error appears in the above-identified patent and that said Letters Patent is hereby corrected as shown below:

<u>Title page,</u>
Item [73], Assignee, after "Rambus Inc., Los Altos, CA (US)", please insert -- ; Intel Corporation, Santa Clara, CA (US) --.

<u>Drawings,</u>
Replace sheet 2 of 4 with the attached drawing sheet.

Signed and Sealed this

Twenty-first Day of October, 2003

JAMES E. ROGAN
*Director of the United States Patent and Trademark Office*

Striped bank indicates that the bank is free and a refresh operation can occur.